(12) United States Patent
Yamaguchi et al.

(10) Patent No.: US 9,342,878 B2
(45) Date of Patent: May 17, 2016

(54) CHARGED PARTICLE BEAM APPARATUS

(75) Inventors: Kohei Yamaguchi, Hitachinaka (JP); Takehiro Hirai, Ushiku (JP); Fumihiko Fukunaga, Mito (JP)

(73) Assignee: Hitachi High-Technologies Corporation, Tokyo (JP)

(*) Notice: Subject to any disclaimer, the term of this patent is extended or adjusted under 35 U.S.C. 154(b) by 373 days.

(21) Appl. No.: 13/991,948

(22) PCT Filed: Oct. 24, 2011

(86) PCT No.: PCT/JP2011/005915
§ 371 (c)(1),
(2), (4) Date: Jun. 6, 2013

(87) PCT Pub. No.: WO2012/077271
PCT Pub. Date: Jun. 14, 2012

(65) Prior Publication Data
US 2013/0265408 A1 Oct. 10, 2013

(30) Foreign Application Priority Data
Dec. 6, 2010 (JP) ................................. 2010-271016

(51) Int. Cl.
| H04N 9/47 | (2006.01) |
| H04N 7/18 | (2006.01) |
| G06T 7/00 | (2006.01) |
| H01J 37/22 | (2006.01) |
| H01J 37/28 | (2006.01) |

(52) U.S. Cl.
CPC .............. *G06T 7/0002* (2013.01); *G06T 7/001* (2013.01); *H01J 37/222* (2013.01); *H01J 37/28* (2013.01); *G06T 2200/24* (2013.01); *G06T 2207/30148* (2013.01); *H01J 2237/221* (2013.01); *H01J 2237/24578* (2013.01); *H01J 2237/24592* (2013.01); *H01J 2237/2817* (2013.01)

(58) Field of Classification Search
None
See application file for complete search history.

(56) References Cited

U.S. PATENT DOCUMENTS

| 6,107,637 A * | 8/2000 | Watanabe et al. .......... 250/559.3 |
| 6,756,589 B1 | 6/2004 | Obara et al. |
| 2005/0200841 A1* | 9/2005 | Talbot et al. ................ 356/237.4 |
| 2006/0060781 A1* | 3/2006 | Watanabe et al. ............. 250/310 |
| 2006/0067571 A1* | 3/2006 | Onishi ........................... 382/149 |
| 2009/0032710 A1* | 2/2009 | Ozawa ........................... 250/311 |

(Continued)

FOREIGN PATENT DOCUMENTS

| JP | 61-140804 A | 6/1986 |
| JP | 2005-142552 A | 6/2005 |
| JP | 2009-186328 A | 8/2009 |

*Primary Examiner* — Joseph Ustaris
*Assistant Examiner* — Talha M Nawaz
(74) *Attorney, Agent, or Firm* — Miles & Stockbridge P.C.

(57) ABSTRACT

For inspection of a pattern such as a semiconductor device, it is useful to selectively detect a defect on the specific pattern in order to estimate the cause of the occurrence of the defect. An object of the invention is to provide a charged particle beam apparatus capable of setting, on the basis of the shape of the pattern on a sample, a region to be inspected. The invention is characterized in that the contour of the pattern on the sample is extracted using a template image obtained on the basis of an image of the sample, the region to be inspected is set on the basis of the contour of the pattern, a defect candidate is detected by comparing the image to be inspected with a comparative image, and the sample is inspected using a positional relationship between the region to be inspected and the defect candidate included in the region to be inspected.

14 Claims, 13 Drawing Sheets

(56) References Cited

U.S. PATENT DOCUMENTS

2009/0034829 A1* 2/2009 Hamada et al. ............... 382/144
2009/0202139 A1* 8/2009 Toyoda et al. ................ 382/145
2010/0177952 A1* 7/2010 Mitsui ........................... 382/141

* cited by examiner

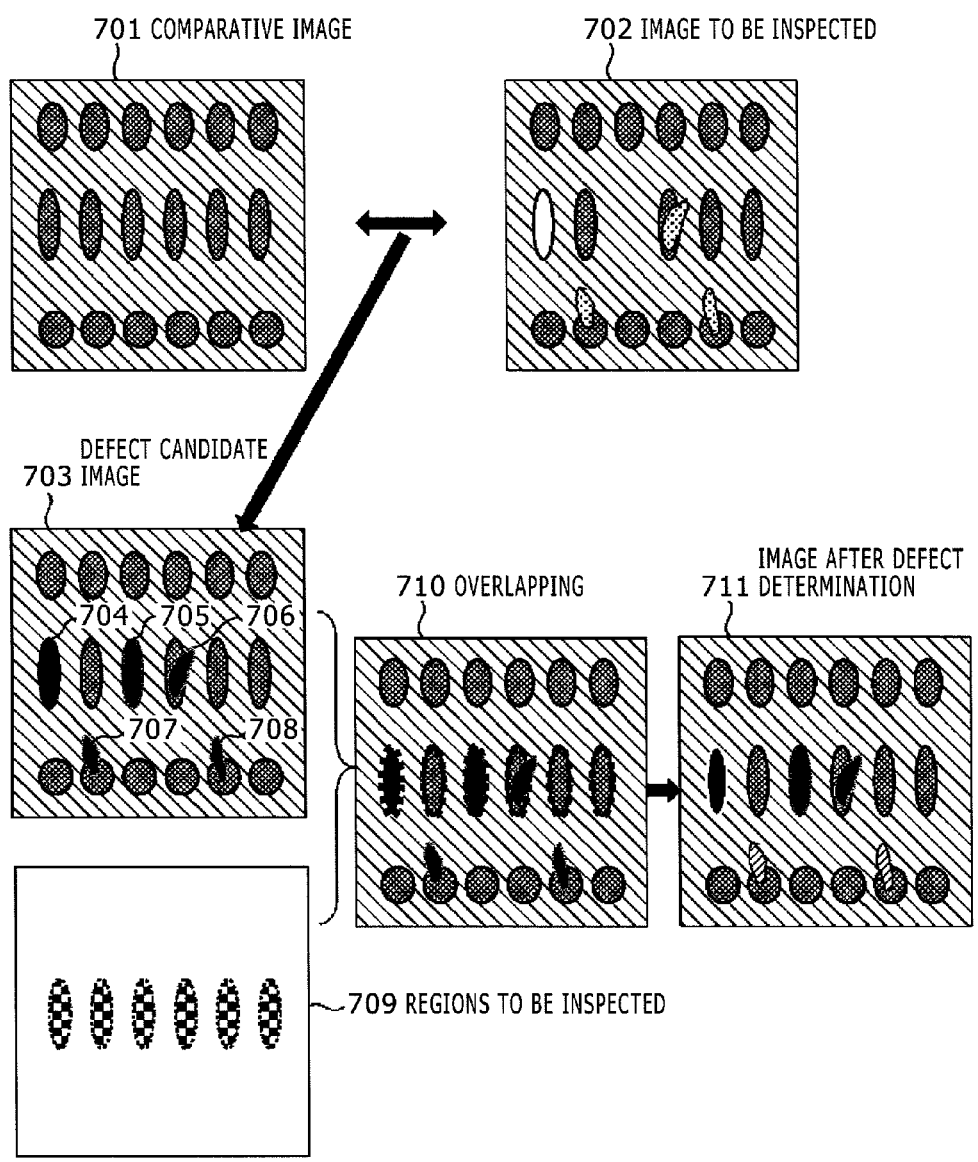

CHARGED PARTICLE BEAM APPARATUS

TECHNICAL FIELD

The present invention relates to a charged particle beam apparatus provided with defect inspection means, and more particularly to a defect inspection apparatus and a review apparatus which use an electron beam.

BACKGROUND ART

Semiconductor devices such as a memory and a microcomputer that are used for a computer or the like are manufactured by repeatedly executing transfer processes such as an exposure process, a lithographic process, and an etching process on a pattern such as, a circuit formed on a photomask. In the process of manufacturing the semiconductor devices, the yield of the semiconductor devices is significantly influenced by whether the results of the lithographic process, the etching process and other processes are good, and the presence of a defect such as a foreign material. Thus, in order to improve the yield, patterns on semiconductor wafers are inspected upon termination of each of the manufacturing processes so that the occurrence of an abnormality and the occurrence of a failure are detected early or in advance.

An inspection apparatus that is used for the aforementioned processes is required to execute inspection with high throughput and high accuracy since the diameters of wafers have been increased and circuit patterns have been miniaturized. To inspect many regions in a short time while the accuracy of the inspection is maintained, there is a method, as one of methods for inspecting a semiconductor device, for specifying a region located on a specified wafer beforehand, picking up images of multiple parts in one inspection, and inspecting the images.

A technique for detecting a defect in a circuit pattern formed on a semiconductor wafer is described in JP-2000-30652-A (Patent Document 1). A method described in Patent Document 1 includes imaging a wafer to be inspected to acquire an image of a pattern to be inspected that includes a defect and an image of a reference pattern that does not include a defect, and comparing the acquired images to extract parts different from each other as defects.

A technique for previously specifying a region to be inspected on a wafer is described in JP-2009-186328-A (Patent Document 2). Patent Document 2 describes a method for automatically detecting a region having a pattern with a desired repeating cycle on the basis of a variance and standard deviation of a differential image between an image having a repeating pattern and an image obtained by shifting the repeating pattern.

In addition, JP-61-140804-A (Patent Document 3) describes a technique for extracting a contour line from an image of a pattern to measure the width of the pattern, and comparing the measured width with design data or another actual pattern.

PRIOR ART DOCUMENTS

Patent Document

Patent Document 1: JP-2000-30652-A
Patent Document 2: JP-2009-186328-A
Patent Document 3: JP-61-140804-A

SUMMARY OF THE INVENTION

Problem to be Solved by the Invention

In recent years, the number of detection of defect candidates has increased along with miniaturization of semiconductor circuits. The defect candidates, however, include defects that have no influence on the yields of products and are not important to users. Thus, to improve the throughput of inspection, it is desirable to selectively detect a defect that a user wants to detect. In addition, detecting defects by dividing a region in which the defects occur is useful for estimating the causes of occurrence of the defects, which significantly helps improvement in the manufacturing yield.

However, since the inspection method described in Patent Document 1 detects all the parts different from each other as defects, it cannot satisfy the demand to selectively detect a defect on a pattern, for example. In addition, since the method described in Patent Document 2 detects only a region that has a repeating pattern, and thereby cannot set a region to be inspected that extends along a pattern on a sample, it cannot meet the aforementioned demand.

An object of the present invention is to provide a charged particle beam apparatus capable of setting, on the basis of the shape of a pattern on a sample, a region to be inspected.

Means for Solving the Problem

In order to solve the aforementioned problems, the invention is characterized in that the contour of a pattern on a sample is extracted using a template image obtained on the basis of an image of the sample, a region to be inspected is set on the basis of the contour of the pattern, a defect candidate is detected by comparing an image to be inspected with an image of apart corresponding to the image to be inspected, and the sample is inspected using a positional relationship between the region to be inspected and the defect candidate included in the region to be inspected.

Effects of the Invention

According to the invention, a defect that occurs on a desired pattern can be selectively detected or classified.

BRIEF DESCRIPTION OF THE DRAWINGS

FIG. 7 is a diagram describing a defect determination process according to the first embodiment.
FIG. 8 is a diagram illustrating an example of a GUI for setting a requirement for detection.

MODES FOR CARRYING OUT THE INVENTION

Hereinafter, embodiments of the invention are described. Although the embodiments of a defect inspection apparatus for detecting a defect on a surface of semiconductor wafer and an inspection of a defect are described, the embodiments are merely examples of the invention, and the invention is not limited to the embodiments described below. For example, defect inspection apparatus described herein widely refers to apparatus that acquire an image and determine, on the basis of the image, whether or not a defect exists. In addition, there are charged particle beam apparatus such as review apparatus that include defect inspection means such as means for inspecting a predetermined position on a sample for fixed-point observation or process monitoring. The invention can naturally be applied to the charged particle beam apparatus, and the defect inspection apparatus described below include the charged particle beam apparatus.

First Embodiment

The first embodiment describes a defect inspection apparatus that extracts defect candidates from a comparative image of a part corresponding to an image to be inspected and displays, as a defect, a defect candidate included in a specified region.

Figure 1:
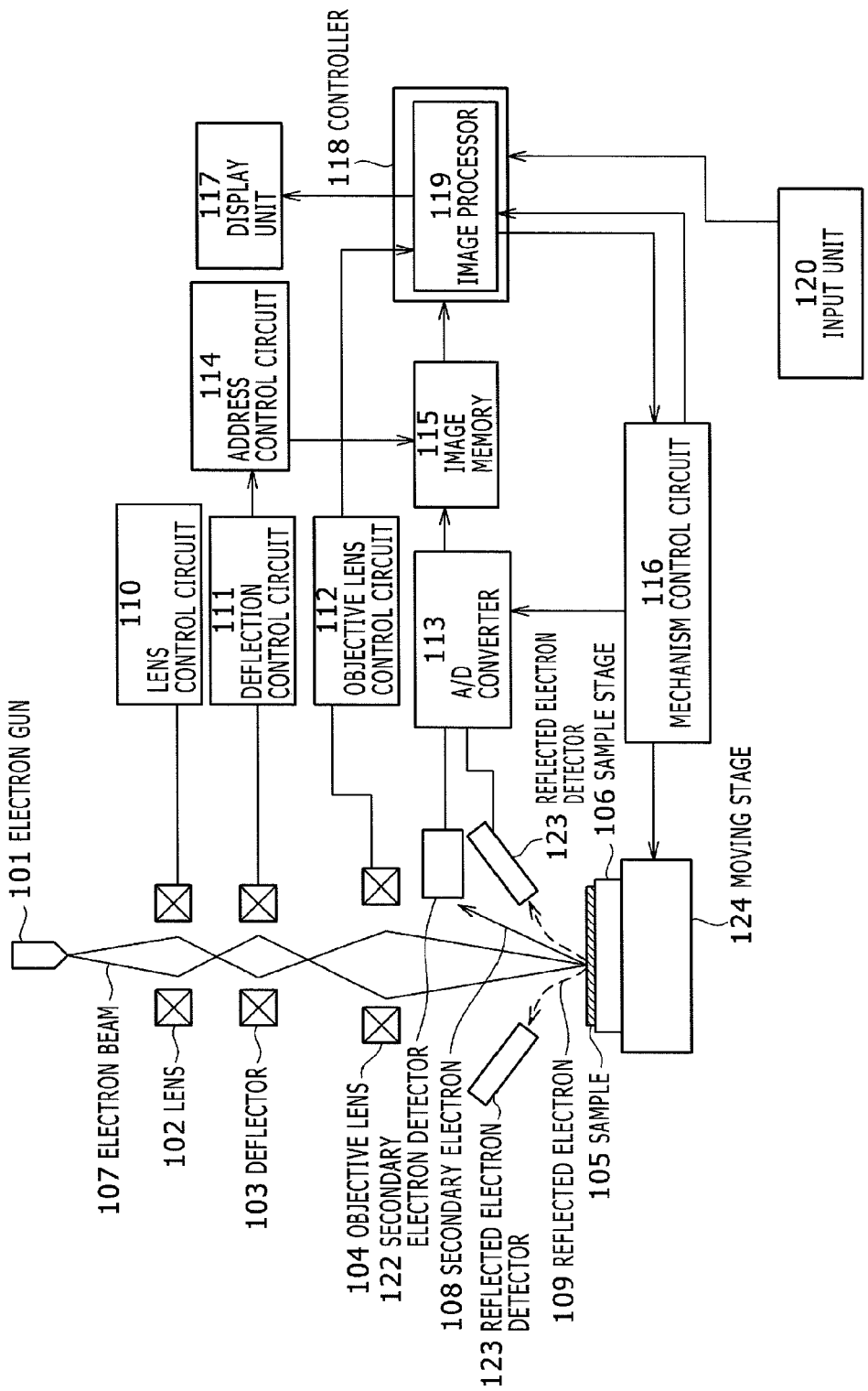
FIG. 1 is a diagram illustrating an overall configuration of a defect inspection apparatus.

FIG. 1 is an outline diagram illustrating an example of an overall configuration of the defect inspection apparatus. The defect inspection apparatus has a scanning electron microscope (SEM) that includes an electron gun 101 for emitting an electron beam 107, a lens 102 for focusing the electron beam 107, a deflector 103 for deflecting and controlling the electron beam 107, an objective lens 104 for focusing the electron beam 107, a sample stage 106 for holding a sample 105, a secondary electron detector 122 for detecting a secondary electron 108 generated by irradiation of the sample 105 with the electron beam 107, reflected electron detectors 123 for detecting reflected electrons 109, and a moving stage 124 for moving the sample stage 106. The reflected electron detectors 123 face each other on a straight line in order to acquire opposing shadow images. These parts are arranged in a column (not illustrated) and can be maintained in a vacuum (not illustrated) by a vacuum pump.

The electron beam 107 emitted from the electron gun 101 is focused by the lens 102 and two-dimensionally deflected by the deflector 103. Then, the electron beam 107 is focused by the objective lens 104, and the sample 105 is irradiated with the electron beam 107. When the sample 105 is irradiated with the electron beam 107, the secondary electron 108 and the reflected electrons 109 are generated on the basis of the shape and material of the sample 105. The secondary electron 108 and the reflected electrons 109 are each detected by the secondary electron detector 122 or the reflected electron detectors 123 and amplified by an amplifier (not illustrated). After the amplification, the secondary electron 108 and the reflected electrons 109 are converted into digital values by an analog-to-digital (A/D) converter 113. Signals from the reflected electron detectors 123 are used to form an L image and an R image that are reflected electron images, while a signal from the secondary electron detector 122 is used to form an S image that is a secondary electron image. Hereinafter, the signals of the reflected electrons and secondary electron, which are obtained from the sample, are collectively referred to as secondary charged particles. Image processing may be executed using the L image, the R image, the S image, or a combined image of these images, unless otherwise specified. In the present description, these images are collectively referred to as images. Data of the converted digital values is stored in an image memory 115. In this case, an address control circuit 114 generates, as an address of the image data stored in the image memory 115, an address that is synchronized with a scanning signal of the electron beam 107. In addition, the image memory 115 transfers the stored image data to an image processor 119 at any time.

The image processor 119 transfers the received image data to a display unit 117 such as a display through a controller 118, executes arithmetic processing on the basis of the image data, and executes a process such as extraction of a defect. The defect extraction (detection) process is to compare the received image data with other image data obtained from a pattern corresponding to the received image data and calculate the image data. The image processor 119 is described later.

The lens 102, the deflector 103, and the objective lens 104 are controlled by control signals from a lens control circuit 110, a deflection control circuit 111, and an objective lens control circuit 112, respectively, and whereby a focal point of the electron beam 107 and the amount of the deflection of the electron beam 107 are controlled. Thus, the electron beam 107 can be adjusted so that an appropriate position on the sample 105 is irradiated with the electron beam 107. In addition, the moving stage 124 that holds the sample stage 106 thereon can be two-dimensionally moved in parallel by a control signal from a mechanism control circuit 116. Thus, the sample 105 that held by the sample stage 106 can be two-dimensionally moved in parallel, and whereby a position to be scanned on the sample 105 with the electron beam 107 can be controlled. The lens control circuit 110, the deflection control circuit ill, the objective lens control circuit 112, and the mechanism control circuit 116 are controlled by signals from the controller 118.

In addition, an input unit 120 such as a keyboard or a mouse is used to operate graphical user interfaces (GUIs) that are used to operate the apparatus and set a parameter and displayed on the display unit 117.

Figure 2:
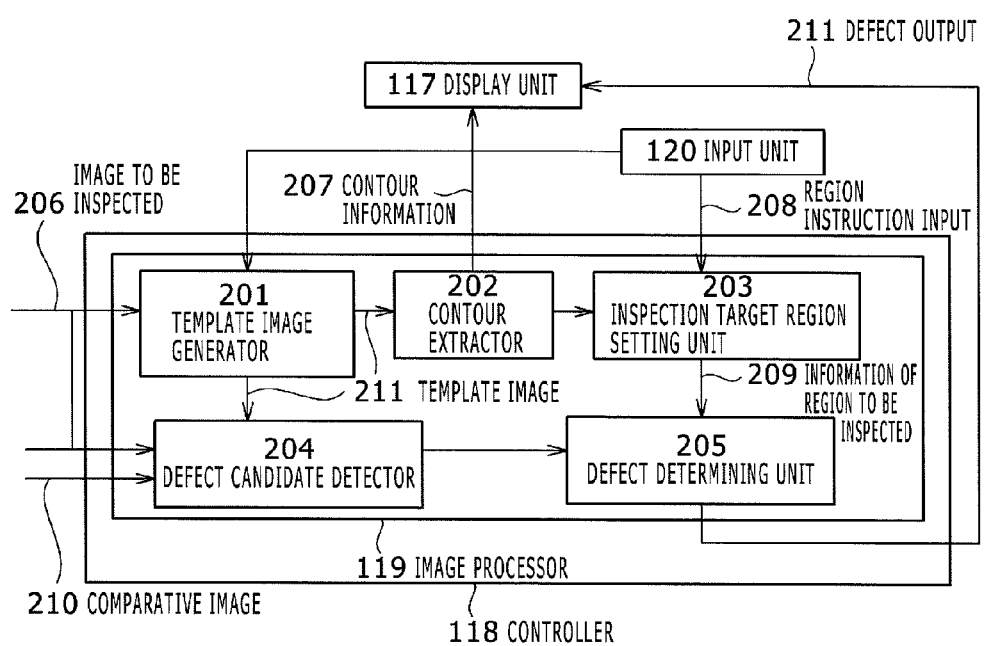
FIG. 2 is a functional block diagram illustrating an image processor.

FIG. 2 is a diagram describing the image processor 119 in detail. The imager processor 119 has a template image generator 201, a contour extractor 202, an inspection target region setting unit 203, a defect candidate detector 204, and a defect determining unit 205. These functional blocks illustrated in FIG. 2 may be configured by combining arithmetic processing circuits for executing processes of the units (so-called hardware implementation), or may be virtually achieved by arranging, in the image processor 119, a memory storing a program corresponding to the processes of the units and causing a processor arranged in the image processor 119 to execute the program. In addition, a part of the functional blocks may be achieved by a dedicated processing circuit, and the other functional blocks may be achieved by the program and the processor in a software manner.

When an image that depicts the sample and is to be inspected is input to the template image generator 201 from the image memory 115, the template image generator 201 treats any of images as a template image automatically or on the basis of an instruction of a user. The template image may be selected by the user from among a plurality of images acquired for selection of the template image or may be generated after arithmetic processing such as an addition process is executed on a plurality of images. In addition, the template image may be generated by executing arithmetic processing on an image 206 to be inspected. Here, the template image is an ideal image that is used to extract the contour of a pattern and considered as an image indicating that a defect does not exist. The image processing that is used to generate a template image is not limited as long as an image that is regarded as an image indicating that a defect does not exist can be generated by the image processing. The template image is referred to as a model image in some cases.

The template image 211 is transmitted to the contour extractor 202, and the contour of a pattern is extracted from the template image 211. This contour is regarded as the contour of a pattern to be formed on a sample manufactured in an ideal process in which a defect does not occur. Information of the contour is displayed in a GUI (described later) by the display unit 117 and is output to the inspection target region setting unit 203.

The user selects, through the input unit 120 on the basis of the contour information displayed by the display unit 117, a region to be inspected that is the inside or outside of the contour of the pattern or the like.

The result of the selection by the user is input to the inspection target region setting unit 203 as a region instruction input 208. The inspection target region setting unit 203 treats the region selected by the user as a region to be inspected and outputs information of region to be inspected 209 to the defect determining unit 205.

In parallel with the aforementioned process, the image 206 to be inspected and a comparative image 210 are input to the defect candidate detector 204 from the image memory 115. The comparative image 210 is an image of a region that corresponds to the image to be inspected or is to be compared with the pattern to be inspected. The comparative image 210 is referred to as a reference image in some cases. The defect candidate detector 204 calculates a differential image between the image 206 to be inspected and the comparative image 210 and treats, as a defect candidate, a part that includes a difference that is equal to or larger than a predetermined threshold. The defect candidate is output to the defect determining unit 205.

The defect determining unit 205 determines, as a defect on the basis of the defect candidate and the information 209 of the region to be inspected, a defect candidate included in the specified region to be inspected, and outputs the defect candidate to the display unit 117. In this case, data of a defect candidate that is not included in the region to be inspected may be deleted by the defect determining unit or displayed by the display unit 117 in a form that enables the defect candidate to be distinguished from the defect included in the region to be inspected.

Figure 3:
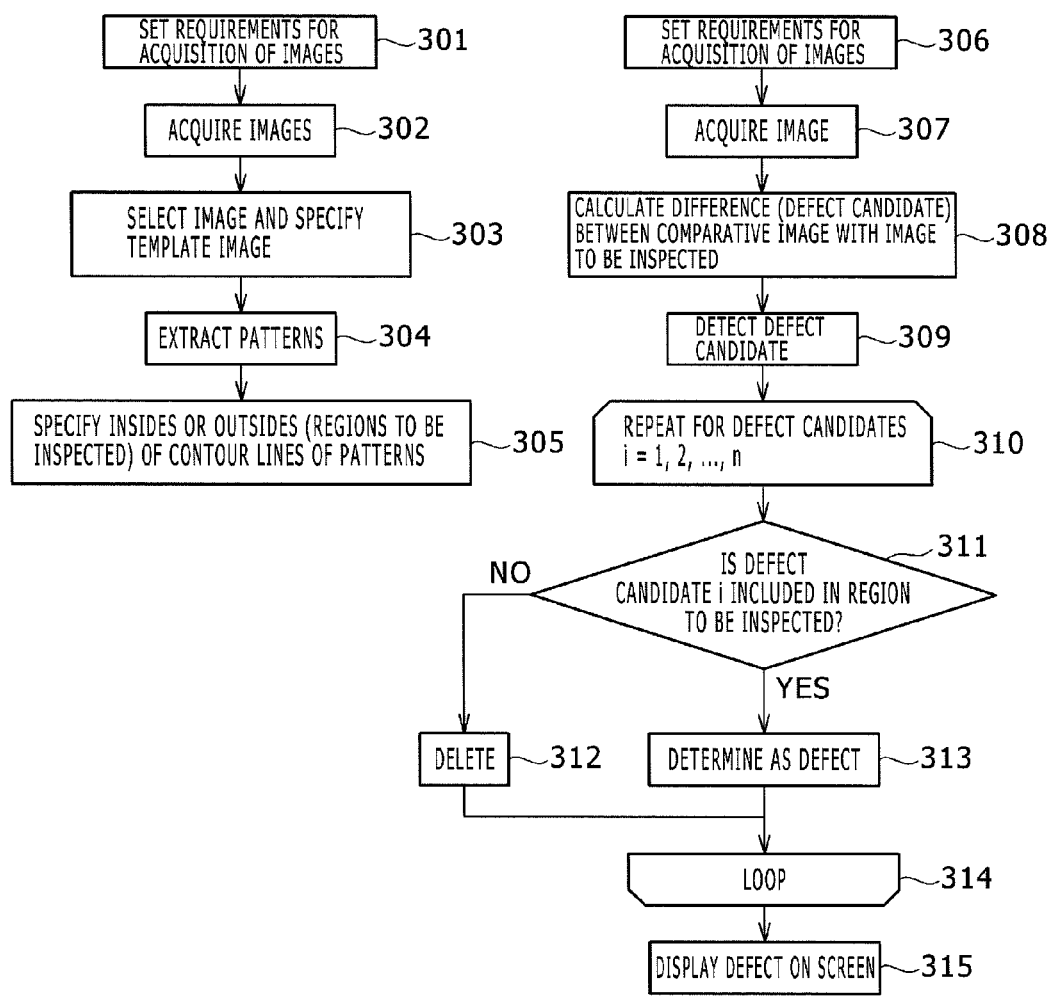
FIG. 3 is a flowchart of a first embodiment.

FIG. 3 is a flowchart of defect detection according to the present embodiment. Hereinafter, the present embodiment is described in detail with reference to FIGS. 3 and 4 to 9.

First, requirements for acquisition of images are set in step 301, and the images are acquired in step 302. The acquisition requirements include a location on the wafer, a location on a die, contrast of the images, brightness, and the number of images to be integrated. An image of a necessary part can be acquired by specifying the aforementioned requirements.

Figure 4:
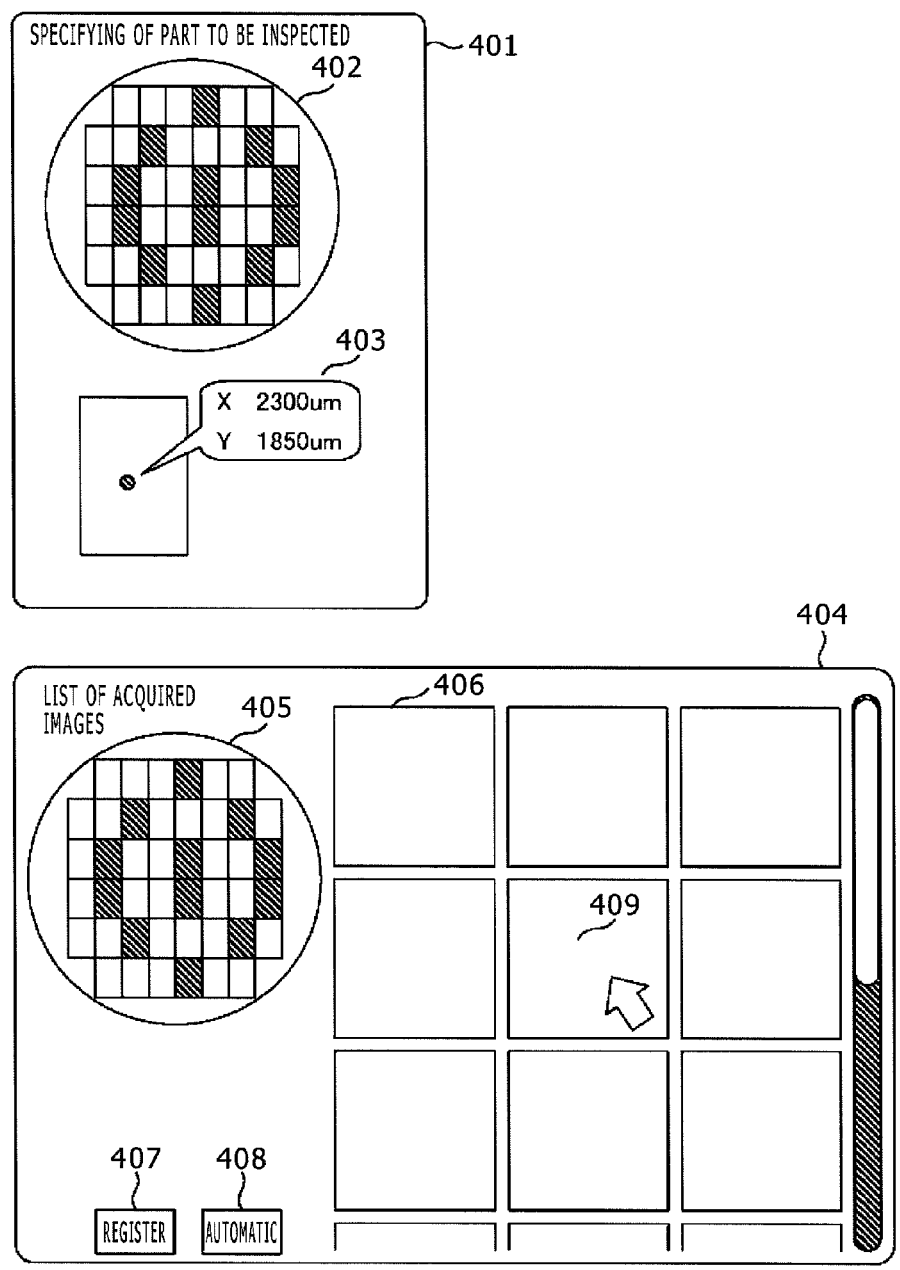
FIG. 4 is a diagram illustrating an example of a GUI for selecting a template image.

FIG. 4 illustrates a GUI 401 for setting regions to be imaged. A plurality of dies exist on the wafer. Coordinates on the wafer are determined on the basis of coordinates specifying a die and relative coordinates specifying a position in the die to the origin in the die, while the origin in the die is treated as a standard. The GUI 401 represents an example in which positions, which are located on a plurality of dies and of which relative coordinates are the same, are inspected. Dies that are represented by gray in a wafer map 402 are dies to be inspected. All dies are not necessarily inspected, and desired dies can be selected and inspected. If a plurality of parts that are included in a single die and have the same pattern formed therein exist, and background patterns of images to be inspected or patterns other than a defective portion are the same, points (coordinates) to be inspected may be different. In this case, regions to be inspected can be extracted from the plurality of parts in a single template image. A die on the wafer map 402 can be selected by clicking the die using the mouse, and coordinates in the die can be specified by directly clicking the inside of the die 403. In addition, values of coordinates of an imaged part may be directly input by the keyboard. Parts that have different patterns can be inspected by repeating the specifying of relative coordinates multiple times.

A list of the acquired images is displayed in a GUI 404, and the user can confirm the images using the keyboard, the mouse, or the like. When the list of the acquired images is collectively displayed in parts 406, the user can easily confirm the images. The images are arranged in the squares 406, respectively. It is user-friendly if the dies on the wafer map 405 are associated with the images and linked to the images so that when a die is specified, a cursor moves to an image of the specified die.

Next, in step 303, a template image is selected from among the acquired images. A target image is clicked and selected from the GUI 404 illustrated in FIG. 4. When a "Register" button 407 is clicked, the target image can be registered as the template image. An image subjected to contrast correction or image processing such as a synthesis process can be registered as well as the acquired image. Although the example in which the user selects the image is described above, an image selected from among the acquired images may be synthesized and automatically set as the template image. In this case, since the template image is automatically set without a selection by the user, a load of the user is reduced. An "Automatic" button 408 illustrated in FIG. 4 is a button for executing this operation. The process of generating or registering the template image is executed by the template image generator 201. The present embodiment describes the example in which the images for selecting a template image are acquired and the user select the image. As described above, however, the template image may be selected by the user using the comparative image 210 or may be automatically generated. The template image may be automatically generated by synthesizing or executing arithmetic processing on a plurality of images to be inspected. The generation method and the selection method may be other methods as long as an image that can be regarded as an image indicating that a defect does not exist can be generated.

Next, in step 304, the contour of a pattern is extracted from the template image. The contour is extracted by determining a boundary of differences between brightness on the basis of a histogram in general. Of course, another method may be used for the extraction.

Figure 5:
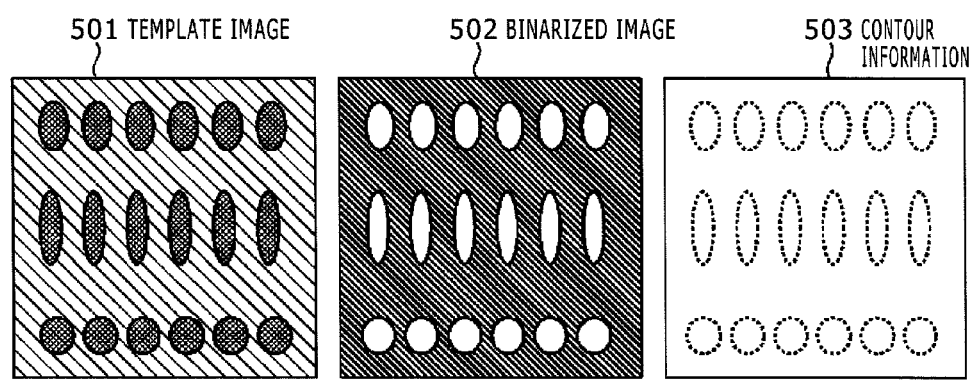
FIG. 5 is a diagram describing extraction of the contours of patterns.

FIG. 5 illustrates an example in which contours are extracted from a template image 501. The contours are extracted by the contour extractor 202 as described above. The template image 501 is binarized using appropriate brightness as a threshold and thereby changed to a binarized image 502. Patterns (white parts of the image 502) are determined from the binarized image 502, and information of lines (dotted lines indicated by 503) of the contours is output to the display unit as contour information 503.

Although the example in which the patterns are closed curves is illustrated, the process of extracting the contour lines is not limited on the basis of the types of the patterns and can be applied to patterns that are line-and-space patterns or the like and are not the aforementioned patterns.

Lastly, in step 305, a region to be inspected is specified. Here, the region to be inspected is a region that is among the patterns of the sample and is specified by the user as a target to be used for inspection of a defect. A defect candidate that is included in the region to be inspected is determined as a defect and presented to the user. The region to be inspected is specified by using a part of the patterns extracted as the contour information for detection of a defect and selecting the outside or inside of the pattern by the user.

Figure 6:
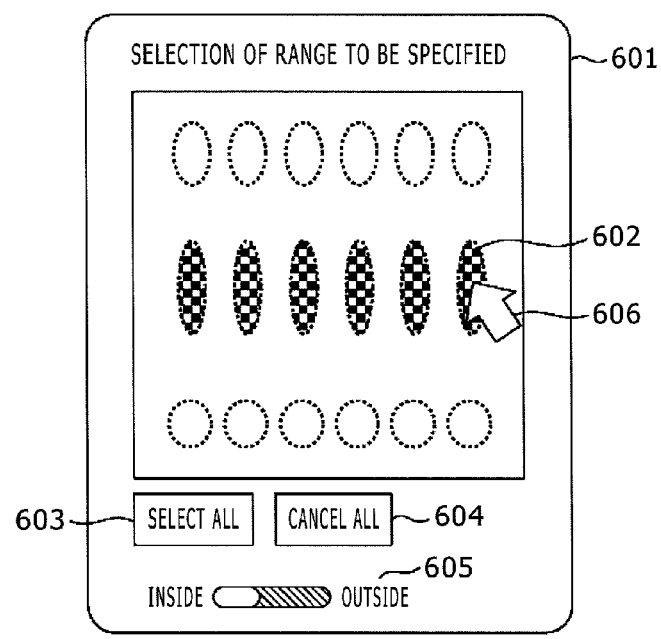
FIG. 6 is a diagram illustrating an example of a GUI for specifying a region to be inspected.

FIG. 6 illustrates a screen for selecting a region to be inspected. An extracted pattern is selected using a GUI 601, and whereby a region to be inspected can be selected. If the selected pattern is displayed with mesh design or a color as indicated by 602, the selected pattern is clear. In addition, if all the patterns are selected, and buttons that are a "Select All" button (603) and a "Cancel All" button (604) and can select or cancel all the patterns are prepared on the GUI 601, the operation is easy. The outsides or insides of the patterns are selected using a part 605. Thus, the insides or outsides of the contour lines of the patterns can be specified as ranges from which a defect candidate is detected as a defect. FIG. 6 illustrates the example in which the insides of patterns that are among the patterns arranged in three rows and are arranged in the central row are selected. In addition, an elliptical pattern and a circular pattern that are illustrated in FIG. 6 can be selected. Furthermore, after all the patterns are selected, the user can operate a cursor 606 using the mouse and individually cancel the selection of a pattern or individually select a pattern. The above is an example of the series of procedures for setting a range.

Next, a method for inspecting the pattern on the semiconductor wafer by using the region to be inspected, which is specified by the aforementioned procedures, is described below.

First, the wafer is scanned with the electron beam, and an image (image to be inspected) of the part specified by the user is acquired (in steps 306 and 307). This procedure is almost the same as steps 301 and 302, and a description thereof is omitted. A die that is different from the die used for the selection of the template image may be selected as a target to be inspected as long as the acquired image is an image of a region corresponding to the images acquired in steps 301 and 302. In addition, if an image is acquired in accordance with the same requirements as step 301, it is not necessary to set the requirements in step 306, and the process may proceed to step 307 while skipping step 306. In addition, if the template image is generated by summing all images of the die that is the target to be inspected, or if the image to be inspected is already acquired in step 302, it is not necessary to newly acquire an image and step 307 may be skipped.

Next, a defect candidate is detected in steps 308 and 309. The defect candidate detector 204 processes the image to be inspected and a comparative image corresponding to the image to be inspected and detects a part in which there is a difference between brightness or a difference between shapes. The defect candidate detector 204 detects a defect candidate by executing calculations in the order of positioning of the image to be inspected and the comparative image, a calculation of differential values between pixels of the images, and extraction of a part of which a differential value is larger than a predetermined threshold. This may cause each of the pixels to be regarded as a defect candidate. Thus, pixels that are adjacent to each of the pixels are regarded as defect candidates and detected.

In FIG. 7, a defect candidate image 703 is obtained as a result of the calculations of a comparative image 701 and an image 702 to be inspected. The defect candidate image 703 includes defect candidates 704 to 708, each of which is displayed as a single defect in a group of pixels of the detected part. In addition, the aforementioned positioning is a method for calculating normalized correlation values in general. No matter which method is used, a shifted amount for the positioning of the image to be inspected and the comparative image is used in the next step 311. The aforementioned method for detecting a defect candidate is merely an example, and another method may also be used.

Next, in step 311, it is determined whether or not a single detected defect candidate that is included in the defect candidate image 703 is included in the region to be inspected. As indicated by overlapping 710 illustrated in FIG. 7, the detected defect candidates 704 to 708 are overlapped with regions 709 to be inspected, and it is determined whether or not the defect candidate is included in the regions to be inspected. Since the coordinates of the defect candidates and selected ranges are known, the determination can be made by comparing the images in consideration of the shifted amount. Reference numeral 710 indicates normal internal processing, and the overlapping 710 may not be displayed to the user.

All parts of the single defect candidate may not be included in the regions to be inspected. For example, more flexible inspection, however, can be executed if a requirement that causes only a defect candidate of which a certain percent is included in the regions to be inspected to be detected as a defect can be determined.

FIG. 8 illustrates an example of a setting GUI. This example indicates, as one of requirements, whether or not a certain percent of the defect candidate is included in the regions to be inspected or whether or not the center of the defect candidate is included in any of the regions to be inspected. The percentage ("90%" in FIG. 8) of the defect within the region to be inspected and a characteristic point ("center" in FIG. 8) of the defect candidate to be determined can be changed by the user through the input unit. In addition, the two requirements illustrated in FIG. 8 are an example, and another requirement can be applied when necessary.

Data of a defect candidate that is determined not to be included in the regions to be inspected in step 311 is deleted in step 312. In addition, if the defect candidate that is not included in the regions to be inspected is to be displayed, the data of the defect candidate is left and the process proceeds to the next step. The defect candidate that is determined to be included in the region to be inspected in step 311 is determined as a defect in step 313 and labeled to be distinguished from a defect candidate that is not included in the regions to be inspected.

The processes of steps 311, 312, and 313 are repeatedly executed on all the defect candidates included in the image to be inspected, and the loop is terminated (in step 314).

The defect candidate that is determined to be included in the region to be inspected is distinguished, overlapped with the image to be inspected or the comparative image, and displayed like an image 711 after the defect determination (in step 315). In the example of FIG. 7, the defect candidates 704 to 706 are displayed as defects, and the defect candidates 707 and 708 are displayed while being distinguished by a color or the like from the defect candidates 704 to 706 determined as the defects. The defect candidates that are not determined as defects may not be displayed. It is sufficient if the defect candidates that are included in the regions to be inspected are displayed while being distinguished, and the display method is not limited to this example.

By selectively displaying a defect candidate as a result in the aforementioned manner, a defect candidate detected in a region in which the user is interested can be distinguished from other defect candidates and output. Especially, in the defect inspection apparatus, many defect candidates are normally detected from regions other than a pattern in which the user is interested. Thus, it is effective to distinguish the defect candidates.

Figure 9:
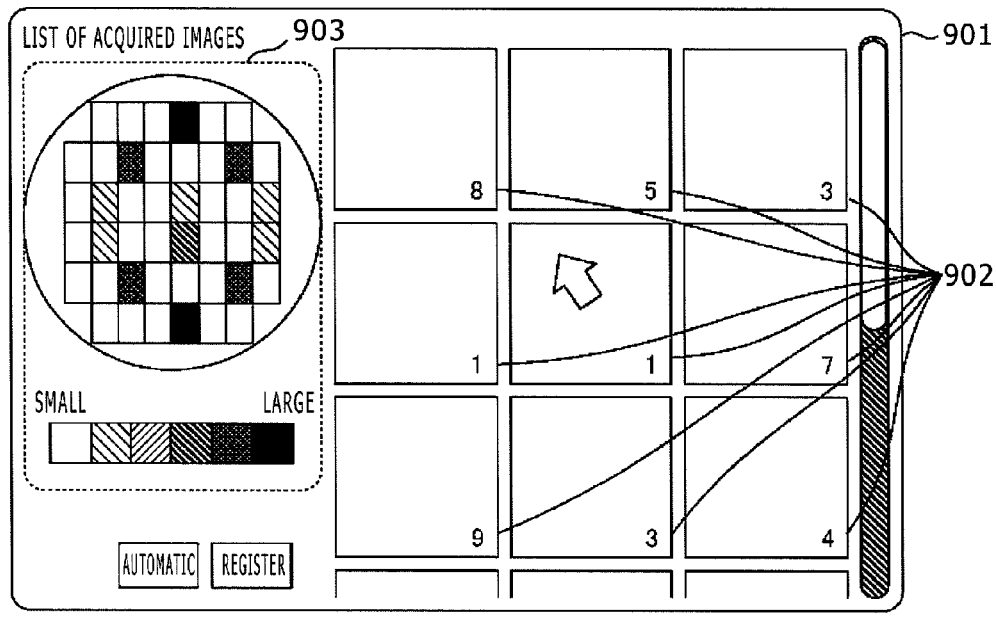
FIG. 9 is a diagram illustrating an example of a GUI that displays detection results.

As illustrated in FIG. 9, the number of defect candidates included in each of the regions to be inspected can be displayed. In FIG. 9, images in which defect candidates included in the regions to be inspected are distinguished are displayed on the right side of a screen, and the number of defects included in each of the images is displayed as indicated by reference numeral 902. In addition, whether the number of defects included in each of the dies on the wafer map is large or small can be distinguished and displayed on the left side of the screen and thereby understood at a glance. In this example, detection results are displayed while being distinguished by a color on the basis of a color bar that is located on the lower side of a part 903 and in which gray levels of the color are associated with values. Thus, a trend of the overall wafer can be confirmed. The aforementioned defect determination process is executed on all or a part of the images to be inspected, and a list of results of the process is displayed as a GUI 901.

The example is described above, in which the template image that includes the patterns located on the wafer to be inspected is temporarily acquired in order to set the regions to be inspected, and after that, the images to be inspected are acquired and inspected. However, the images to be inspected and the template image can be acquired simultaneously. In this case, an image that depicts an ideal pattern and is obtained by synthesizing the images to be inspected is treated as the template image. Thus, it is not necessary to reacquire the images to be inspected after the selection of the regions to be inspected, since the images to be inspected are acquired in order to generate the template image. A period of time to acquire images can be therefore reduced, and it is expected to improve the throughput.

Images (comparative images) that are acquired with the images to be inspected and used for the comparison may be treated as template images. Specifically, a comparative image and an image to be inspected are acquired for each of imaged parts, the contours of patterns are extracted from the comparative images, the process of setting the regions to be inspected is executed, and the defect candidate extraction and the defect determination process are executed on each of the images to be inspected and the comparative images corresponding to the images to be inspected after the acquisition of the images to be inspected. The comparative images normally depict different dies and are images of regions of which relative coordinates in the dies are the same in many cases.

As described in the present embodiment, since a defect candidate of a region to be inspected is selectively determined as a defect, the user performs inspection while paying attention to a defect to be inspected. In addition, since a defect candidate that is not included in the regions to be inspected can be removed, an effect of removing unnecessary noise from detection results is provided.

Second Embodiment

The second embodiment describes a defect inspection apparatus that enlarges or reduces an extracted contour of a pattern and sets a region to be inspected.

The outline of the apparatus to be used is the same as the parts described with reference to FIG. 1. Hereinafter, a description of the same parts as the first embodiment is omitted.

Figure 11:
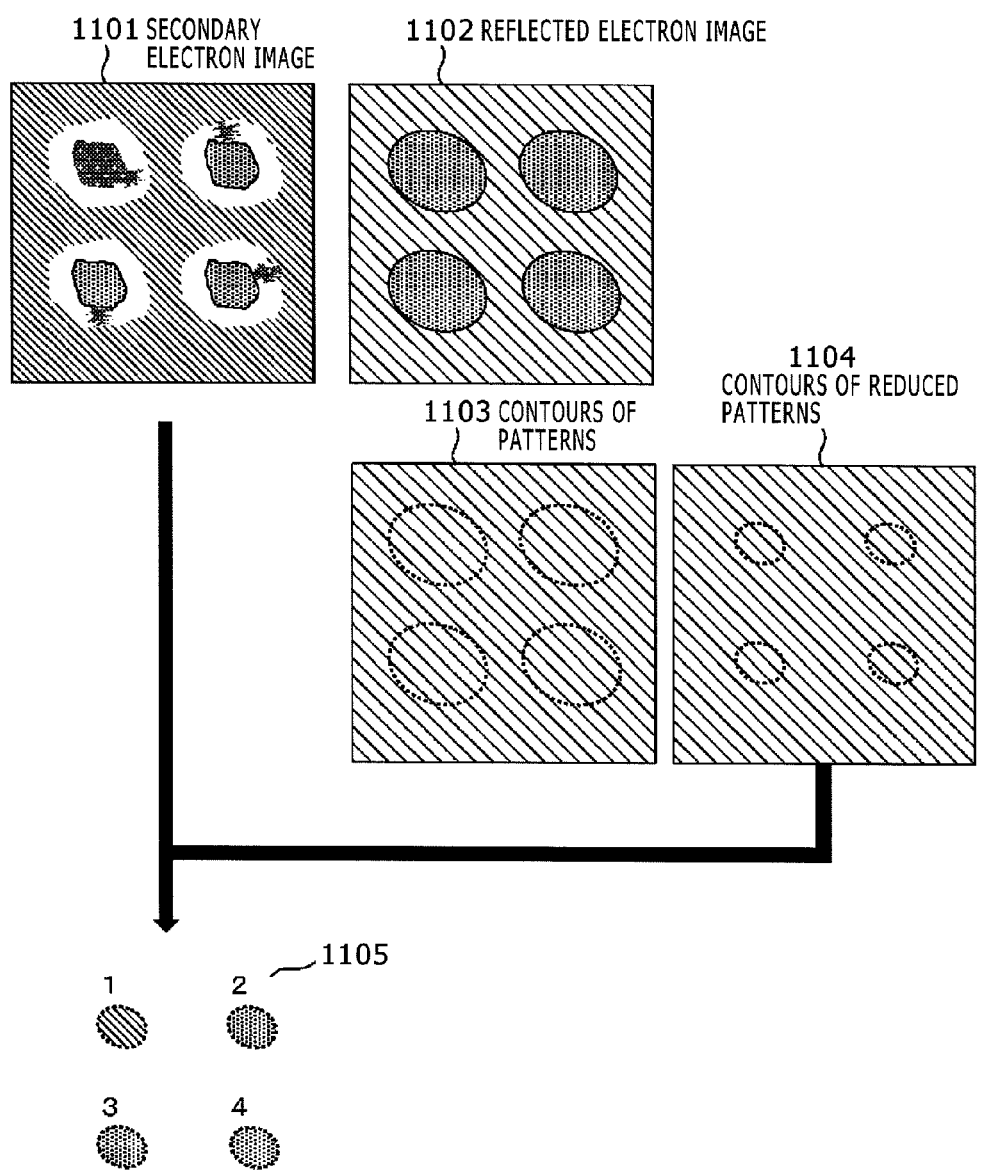
FIG. 11 is a diagram illustrating an example in which patterns are enlarged or reduced to set regions to be inspected.

Images 1011 and 1012 are schematically illustrated on the upper side of FIG. 11 and obtained by imaging pattern of holes, and indicate a secondary electron image 1101 and a reflected electron image 1102 that are obtained by imaging the same part. If the brightness of bottom portions of the holes of this pattern is detected, and the holes are to be distinguished on the basis of the brightness, edge parts of the hole patterns blur in the secondary electron image 1101. It is, therefore, difficult to selectively extract a bottom portion of a hole by the method described in the first embodiment. In addition, an image of an edge portion of a hole may vary depending on how irradiation is executed with the electron beam. It is difficult to accurately specify the edge portion of the hole pattern. On the other hand, in the reflected electron image 1102, the shapes of the holes are clearly imaged and extraction is easy. In the reflected electron image 1102, however, the bottom portions of the holes are not imaged and cannot be detected.

As described below, the outer shapes of the holes are extracted from the reflected electron image 1102, regions of the outer shapes are reduced to sizes of the hole bottom portions depicted in the secondary electron image 1101, and whereby almost all parts of the hole bottom portions can be surrounded and the brightness of the hole bottom portions can be detected from values of pixels of the parts. In this manner, semiconductor patterns can be more flexibly inspected by enlarging or reducing pattern contours extracted from an image and specifying the regions to be inspected that are described in the first embodiment. An example of this process is described below.

Figure 10:
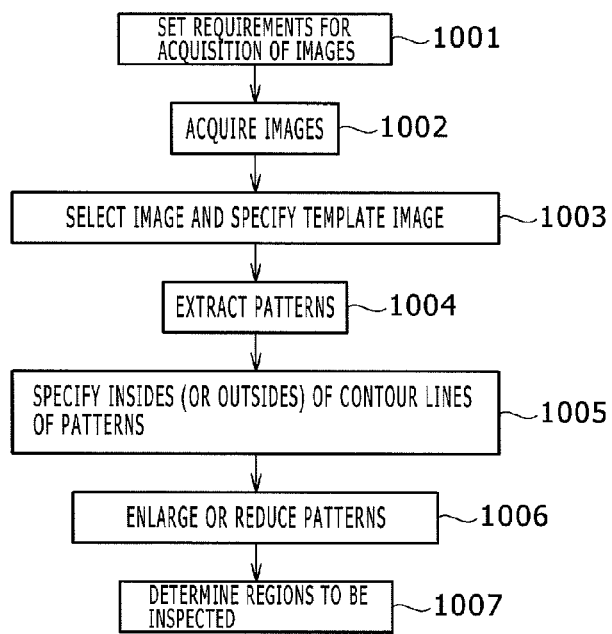
FIG. 10 is a flowchart of a second embodiment.

FIG. 10 is a flowchart of a process that is described in the present embodiment. A procedure for generating a template image is the same as steps 301 to 304 that are described with reference to FIG. 3 in the first embodiment and correspond to steps 1001 to 1004 illustrated in FIG. 10. It is to be noted that, if a template image is selected in step 1003, a secondary electron image and a reflected electron image are separately displayed, and the user may specify a region depicted in an image to be used as the template image and may specify whether the secondary electron image or the reflected electron image is used. Whether the secondary electron image or the reflected electron image is used on the basis of the type of a sample may be set using a recipe or the like. In addition, a secondary electron image, a reflected electron image, or an image obtained by synthesizing the secondary electron image and the reflected electron image may be displayed as a representative for each of regions of dies, the user may select an image of any of the regions as a template image, and a secondary electron image or a reflected electron image may be automatically set as the template image. In this case, it is preferable that whether the secondary electron image or the reflected electron image is used as an image to be inspected can be specified by the user or automatically set. Thus, a detector that detects an image to be used as a template image or an image to be inspected can be set.

In step 1005, a pattern that is used to specify a region to be inspected is specified using a contour line of a pattern extracted in step 1004. In addition, the inside or outside of the contour line is specified. Subsequently, in step 1006, the contour line of the pattern selected in step 1005 is enlarged or reduced and thereby adjusted to a size desired by the user. The information specified in steps 1005 and 1006 is combined, and a region to be inspected is determined in step 1007. Specifically, the enlarged or reduced pattern is treated as a new template image and the region to be inspected is set. Step 1006 may be executed after step 1005.

Processes after the setting of the region to be inspected are the same as the first embodiment. Specifically, an image to be inspected is acquired and it is determined whether or not defect candidates included in the image to be inspected are included in the specified region to be inspected.

The example is described above, in which the template image that includes the patterns located on the wafer to be inspected is temporarily acquired in order to set the regions to be inspected, and after that, the images to be inspected are acquired and inspected. As described above, however, the images to be inspected and the template image may be acquired simultaneously. In this case, an image that depicts an ideal pattern and is obtained by synthesizing the images to be inspected can be treated as the template image. Thus, if the images to be inspected are stored in the memory, it is not necessary to reacquire the images to be inspected after the selection of the regions to be inspected. This is due to the fact that the images to be inspected are acquired in order to generate the template image. A period of time to acquire images can be therefore reduced, and it is expected to improve the throughput.

Images (comparative images) that are acquired with the images to be inspected and used for the comparison may be treated as template images. Specifically, a comparative image and an image to be inspected are acquired for each of imaged parts, the contours of patterns are extracted from the comparative images, the process of setting the regions to be inspected is executed, and the defect candidate extraction and the defect determination process are executed on each of the images to be inspected and the comparative images corresponding to the images to be inspected after the acquisition of the images to be inspected. The comparative images normally depict different dies and are images of regions of which relative coordinates in the dies are the same in many cases.

The contents of the processes of steps 1005 to 1007 are described in detail with reference to FIG. 11. Reference numerals 1101 and 1102 indicate the secondary electron image and the reflected electron image, respectively. It is assumed that the secondary electron image 1101 is used as an image to be inspected and the reflected electron image 1102 is used as a template image. When the contours of the patterns are extracted from the reflected electron image 1102 serving as the template image, contours indicated by 1103 are obtained. When the contours are enlarged or reduced at a rate specified by the user, contours indicated by 1104 are obtained. An example in which the pattern contours indicated by 1103 are reduced is illustrated as indicated by 1104. By overlapping the contours indicated by 1104 with the secondary electron image 1101 serving as the image to be inspected, only parts (1 to 4 of 1105) of regions to be inspected can be selected and inspected. In this example, the brightness of the hole bottom portions can be accurately detected. All or a part of the images 1101 to 1105 may be displayed by the display unit or may not be displayed.

Figure 12:
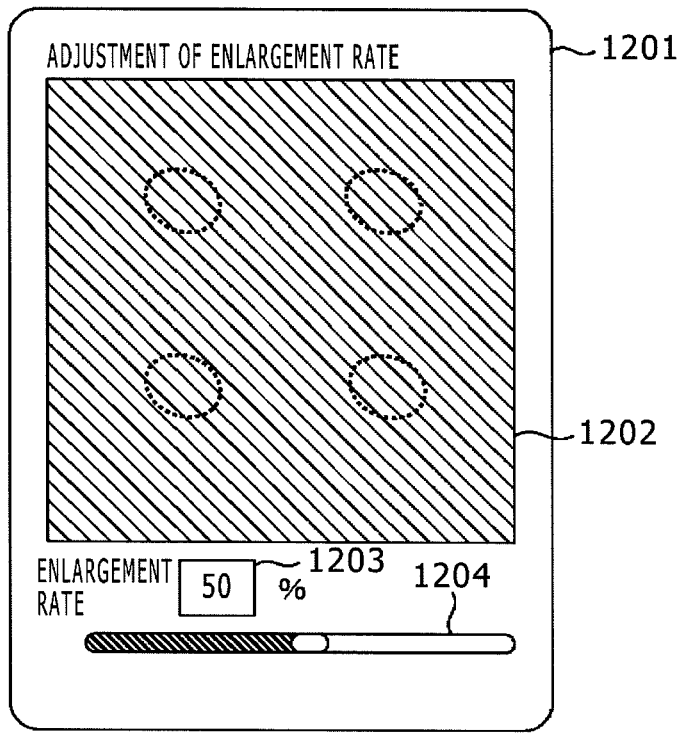
FIG. 12 is a diagram illustrating an example of a GUI for specifying an enlargement rate.

The rate of the enlargement or reduction is adjusted on a screen illustrated in FIG. 12. By inputting the enlargement rate in an input field 1203 on a GUI 1201, pattern can be enlarged or reduced on the basis of the input value. In addition, the user can confirm the enlarged or reduced pattern using a slide bar 1204 in real time. In addition, an image 1202 of pattern contours enlarged or reduced on the basis of the currently specified rate is displayed on the GUI 1201. Since whether or not the sizes of the enlarged or reduced pattern contours match regions to be inspected can be easily confirmed by overlapping the image 1202 with an image to be inspected and displaying the image 1202 and the image to be inspected, the usability is improved. The setting means is an example and is not limited to this example. In addition, regarding the operation for the pattern contours, the pattern contours can be moved as well as the enlargement and reduction of the pattern contours. Furthermore, a pattern to be operated can be specified on the GUI 1201, and the operation of enlarging or reducing a part of the patterns within the image 1202, the operation of moving a part of the patterns within the image 1202, or another operation can be executed.

Figure 13:
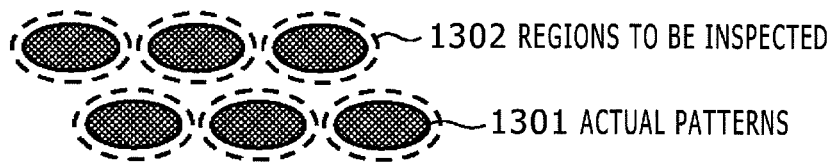
FIG. 13 is a diagram illustrating an example in which patterns are enlarged to set regions to be inspected.

The example is described above, in which the patterns obtained from the template image are reduced and treated as the regions to be inspected. By enlarging the patterns obtained from the template image and treating the enlarged patterns as regions to be inspected, an abnormality of the periphery of the patterns can be inspected. For example, as illustrated in FIG. 13, when regions 1302 (dotted lines) to be inspected are obtained by enlarging actual patterns 1301, the regions that include the contours of the actual patterns 1301 can be inspected.

Figure 14:
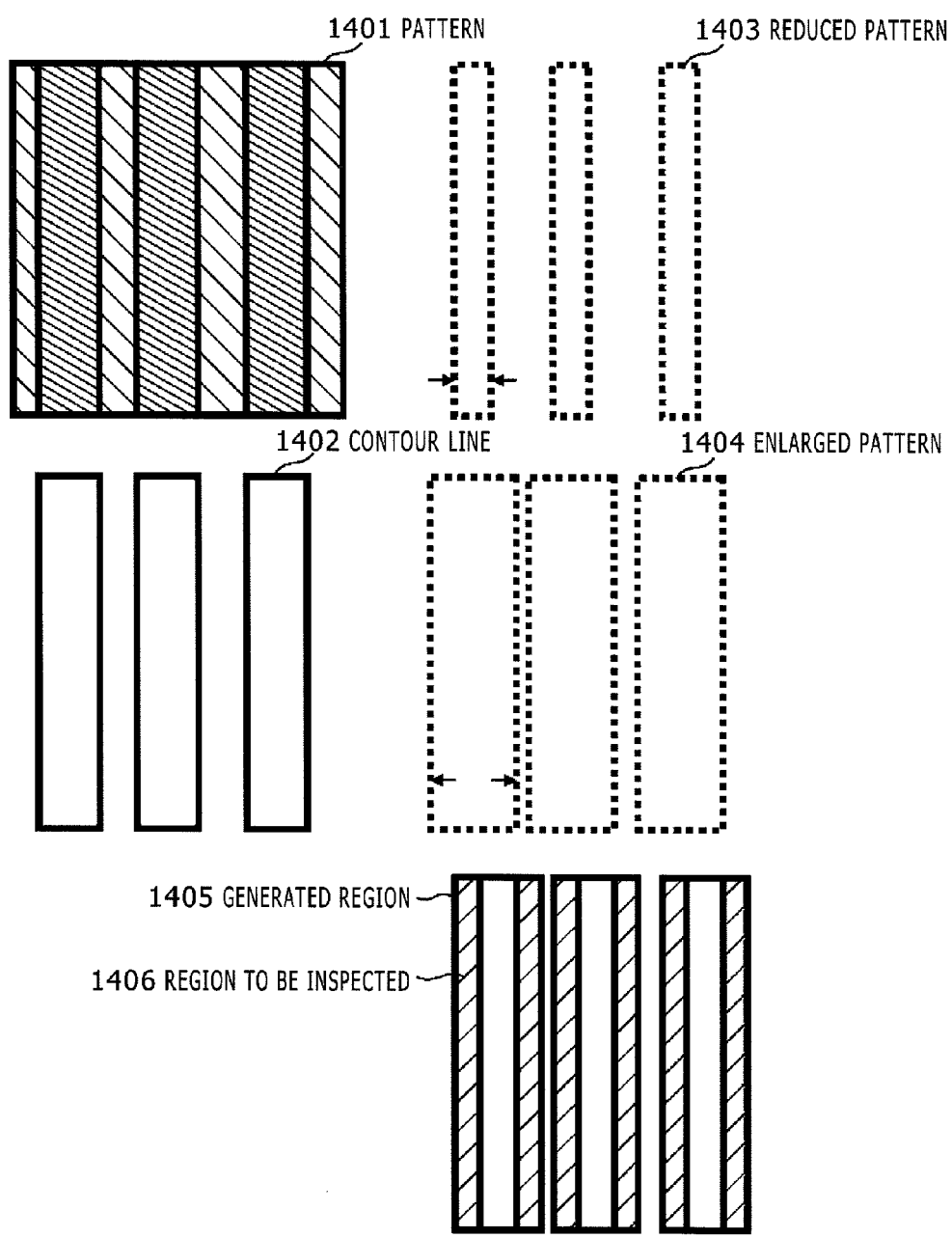
FIG. 14 is a diagram illustrating an example in which regions with enlarged and reduced patterns are calculated to set regions to be inspected.

In addition, as illustrated in FIG. 14, regions to be inspected can be specified using regions obtained by calculating regions obtained on the basis of contour lines of patterns. A region 1405 that is generated by subtracting a region specified by a pattern 1403 obtained by reducing a contour line 1402 of a pattern 1401 from a region specified by a pattern 1404 obtained by enlarging the contour line 1402 of the pattern 1401 is a region that surrounds the periphery of the contour line 1402 of the pattern 1401. In this case, the region 1405 generated by this calculation is treated as a new template image. By using this region to specify a region 1406 to be inspected, a foreign material that exists at a boundary of the pattern, and a defect of the pattern, can be detected.

Although the second embodiment describes the example in which the template image is deformed or the example in which the pattern contours generated from the template image are enlarged or reduced, the second embodiment has a feature in which a secondary electron image and a reflected electron image are used to specify a region to be inspected. Specifically, images of different detectors can be used for a template image and an image to be inspected. As described above, a secondary electron image and a reflected electron image can be used for the template image and the image to be inspected and need to be appropriately selected. Especially, it is preferable that an image from which the contour of a pattern can be precisely extracted be selected as the template image, while it is preferable that an image in which a part to be inspected by the user is clearly depicted be selected as the image to be inspected.

The example in which the reflected electron image is used as the template image for the secondary electron image is described above. However, the secondary electron image can be used as the template image for the reflected electron image. For example, if a step of a pattern after embedding and CMP is small, the pattern cannot be confirmed without a secondary electron image with excellent material contrast and it is difficult to detect an irregularity without a reflected electron image. In this case, a secondary electron image is used as a template image for a reflected electron image that is an image to be inspected, and whereby the pattern can be selectively detected.

Third Embodiment

The third embodiment describes a defect inspection apparatus that evaluates the qualities of extracted patterns on the basis of a positional relationship among defect candidates for the extracted patterns and classifies the patterns for each of the qualities. Here, the qualities means perfection levels of the actually formed patterns with respect to an ideal pattern. Specifically, the qualities means quantitative indexes to be used not only to determine a non-defective or defective state but also to evaluate how much evaluation items (intervals between the patterns, states of curved corners, and the like) of the wiring patterns are deviated from ideal values. Here, the ideal values indicate values determined by a circuit designer, such as simulation values of lithography. Hereinafter, a pattern of a template image is used for the ideal values, and deviations of an actually imaged pattern froth the ideal values are evaluated. Thus, the qualities can be interpreted as evaluation values for amounts shifted from the ideal pattern (template image).

In the following, an example is described in which the qualities are evaluated using differences between the shape of the ideal pattern and the shapes of the actual patterns and positional relationships between the patterns, and the patterns are classified on the basis of results of the evaluation.

An outline of the apparatus to be used is the same as the parts described with reference to FIG. 1 in the first embodiment. Hereinafter, a description of parts that are the same as the first embodiment is omitted.

Figure 15:
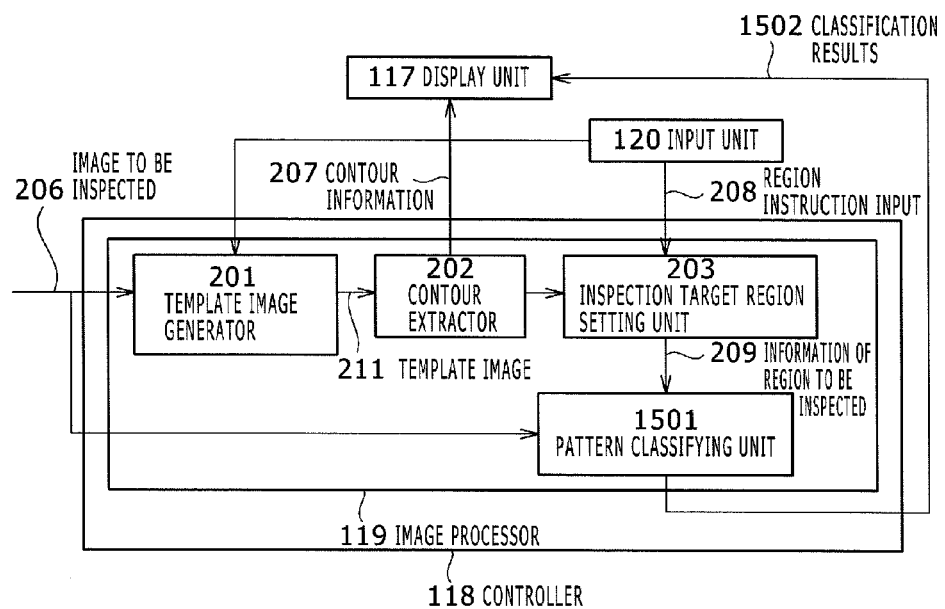
FIG. 15 is a functional block diagram illustrating an image processor according to a third embodiment.

First, the inside of the image processor 119 is described with reference to FIG. 15. Parts that are the same as those described with reference to FIG. 2 in the first embodiment are indicated by the same numbers as FIG. 2. In the present embodiment, a pattern classifying unit 1501 is added to the configuration illustrated in FIG. 2 or is arranged instead of the defect candidate detector and the defect determining unit that are illustrated in FIG. 2. In FIG. 15, in order to simplify the description, the defect candidate detector and the defect determining unit are omitted. Functional blocks illustrated in FIG. 15 may be achieved by hardware implementation, software implementation, or a combination of the hardware implementation and the software implementation in the same manner as the first embodiment.

The pattern classifying unit 1501 executes a process of classifying a pattern that corresponds to a region to be inspected and is included in an image to be inspected, as described later. It is, therefore, necessary that information of the region to be inspected and the image to be inspected be input to the pattern classifying unit 1501.

Figure 16:
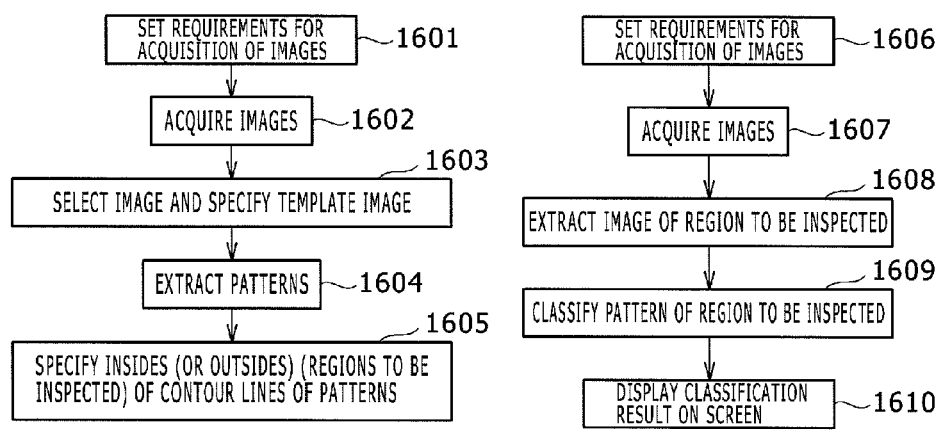
FIG. 16 is a flowchart of the third embodiment.

FIG. 16 is a flowchart of the process that is described in the present embodiment. A procedure for determining a template image and a region to be inspected is the same as the first embodiment, processes that are the same as steps 301 to 305 illustrated in FIG. 3 and described in the first embodiment are executed in steps 1601 to 1605. Image acquisition (of steps 1606 and 1607) after setting of the region to be inspected is the same as the first embodiment, and a description thereof is omitted.

In step 1608, an image of the region to be inspected is extracted from an image to be inspected. Since a foreign material may exist in a pattern included in the image to be inspected or the pattern may crack, the pattern may not be ideal. Thus, a part that corresponds to the region that has been extracted from the template image and is to be inspected is extracted from the image to be inspected.

Next, in step 1609, an image of the region to be inspected that has been extracted in step 1608 is classified. A process that is related to the classification is described in detail later.

Lastly, in step 1610, the classified result is displayed on the screen. In this case, the classified result may be subjected to a statistical process and displayed. This process is described later.

Figure 17:
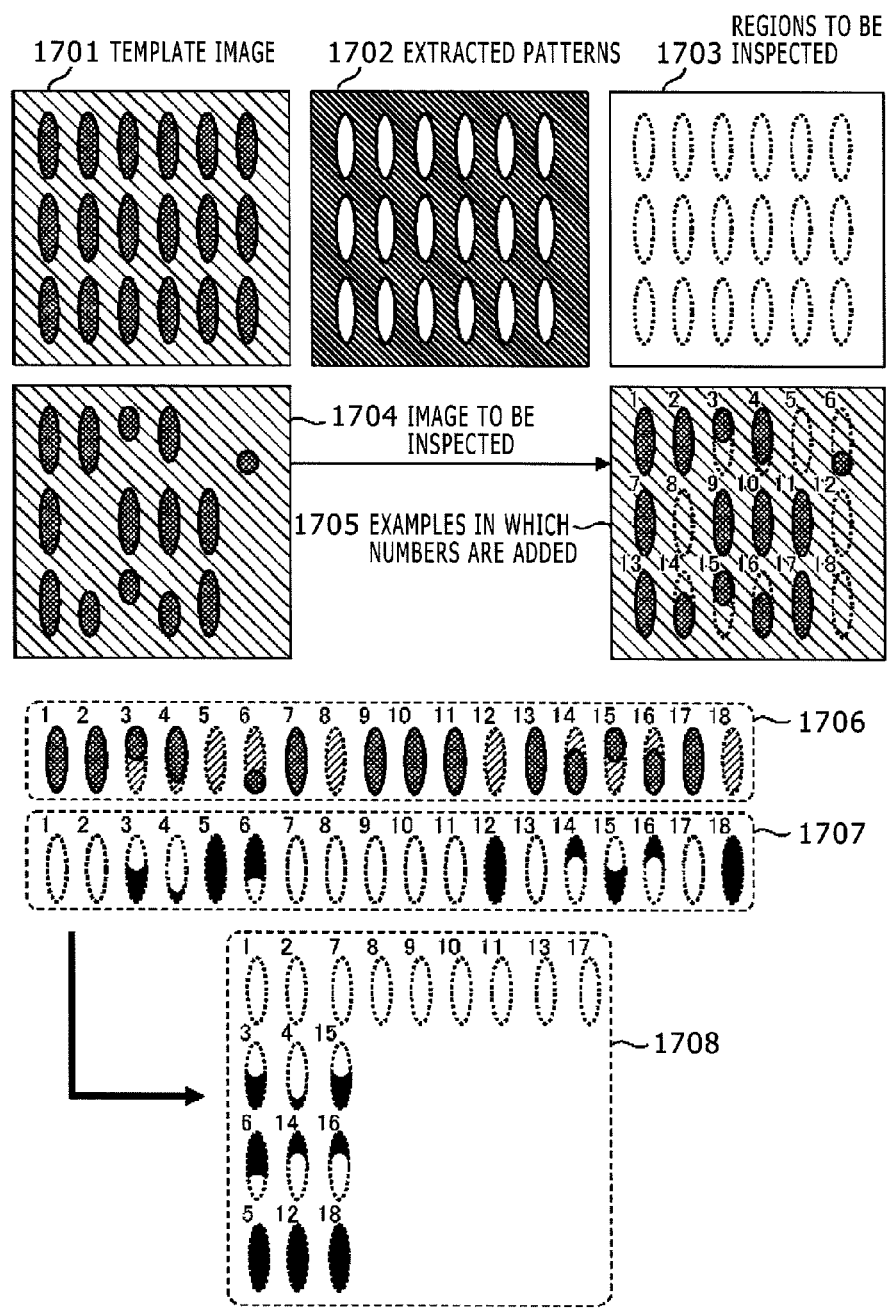
FIG. 17 is a diagram describing a process of classifying a pattern.

The classification process is described in detail with reference to FIG. 17.

Patterns are extracted by executing arithmetic processing such as a binarization process on a template image 1701 in the same manner as the first embodiment. The obtained patterns are indicated by 1702. Next, regions 1703 to be inspected are determined using the patterns 1702. Dotted lines of the regions 1703 are contour lines of the patterns 1702. In this example, the insides of the contour lines are the regions to be inspected.

Next, images of parts corresponding to the regions 1703 to be inspected are extracted from an image 1704 to be inspected, and numbers are added to the extracted parts, respectively, as indicated by 1705. Specifically, as illustrated in FIG. 17, the regions 1703 to be inspected and the image 1704 to be inspected are overlapped and positioned, and the numbers are sequentially added to the patterns. Reference numeral 1705 indicates an example in which the numbers of 1 to 18 are added to the patterns surrounded by dotted lines. Reference numeral 1706 indicates that the extracted images of the regions are arranged using the numbers.

When the images 1706 are viewed, regions that include overall patterns, regions that include parts of patterns in upper portions, regions that include parts of patterns in lower portions, and regions that do not include a pattern can be confirmed. The extracted images are classified using relationships between the regions to be inspected and the actual patterns. Specifically, the patterns are classified by evaluating differences between the shapes of parts, corresponding to the regions to be inspected, of the image to be inspected and the shapes of the regions to be inspected and positional relationships between the parts of the image and the regions to be inspected. The actual patterns indicate patterns of the image to be inspected and include patterns recognized as normal patterns and defect candidates caused by abnormalities of patterns. Note that a pattern, which is not an ideal pattern and of which a deviation from the ideal pattern is in an error margin, is regarded as a normal pattern in some cases.

A specific example of the classification process is described. The extracted patterns of the images 1706 are binarized, and whereby images 1707 are obtained. The images are classified on the basis of the ratios of occupied areas of white pattern portions to the areas of the images 1707 and the positions of the centers of gravity of the white pattern portions. For example, if the images are classified into an image including 95% or more of white portion, an image including 95% or less of a white portion of which the center of gravity is located in an, upper half of an extracted region, an image including 95% or less of a white portion of which the center of gravity is located in a lower half of an extracted region, and an image including 5% or less of a white portion, the extracted images are classified as indicated by reference numeral 1708. When the images are classified in the aforementioned manner, the number of normal patterns, the percentage of the normal patterns, and the number of parts in which a pattern does not exist can be calculated.

Although the pattern classification process according to the present embodiment is described above with reference to FIG. 17, the images illustrated in FIG. 17 and the numbers 1 to 18 illustrated in FIG. 17 are added in order to explain the internal processing and may not be displayed in the actual apparatus to the user.

Figure 18:
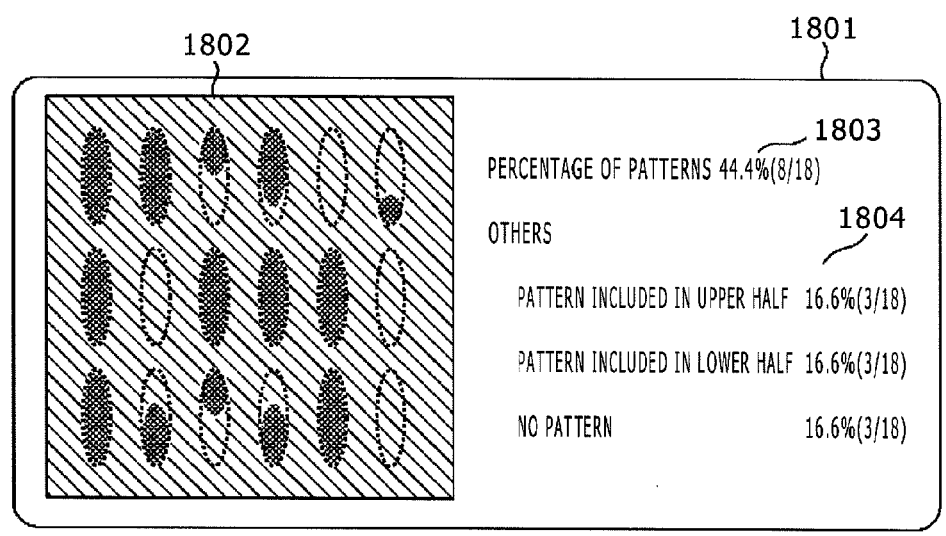
FIG. 18 is a diagram illustrating an example of a GUI that displays classification results.

FIG. 18 illustrates a GUI 1801 that displays results of classification. Reference numeral 1802 indicates an example of an image obtained by overlapping an image to be inspected with regions (dotted line parts) to be inspected, reference numeral 1803 indicates the percentage of normal patterns, and reference numeral 1804 indicates details of other patterns and the percentages of the other patterns. The classification of the patterns may independently depend on a cause related to manufacturing and provides information that is important to pursue the cause of a reduction in the yield. The percentages with respect to the total may be represented in the aforementioned manner. The number of patterns conforming to requirements for classification may be displayed. If a graph of the classification results is displayed, it is easier to understand the results. The aforementioned classification standards, the classification method, and the method for displaying results are examples described to explain the classification, while other classification standards, another classification method and another method for displaying results may be used. If the classification standards can be set or changed by the user, the classification process can be more flexibly executed. Inspection results can be easily understood by executing the statistical process in order to classify the qualities of the patterns in the aforementioned manner.

The enlargement and reduction of patterns are described in the second embodiment and can be applied to the present embodiment. By enlarging patterns obtained from a template image and treating the patterns as regions to be inspected, the patterns and abnormalities of peripheries of the patterns can be classified.

As described in the first to third embodiments, a pattern region in which the user is interested can be distinguished from other regions by extracting the contour of the pattern of a sample using a template image obtained on the basis of an image and specifying the inside or outside of the pattern as a region to be inspected. Thus, inspection results can be recognized, while a defect occurred in the pattern in which the user is interested is distinguished from a defect occurred in another region. In addition, the quality of the pattern specified as the region to be inspected can be easily evaluated.

DESCRIPTION OF REFERENCE NUMERALS

101 Electron gun
102 Lens
103 Deflector
104 Objective lens
105 Sample
106 Sample stage
107 Electron beam
108 Secondary electron
109 Reflected electron
110 Lens control circuit
111 Deflection control circuit
112 Objective lens control circuit
113 Analog-to-digital converter
114 Address control circuit
115 Image memory
116 Mechanism control circuit
117 Display unit
118 Controller
119 Image processor
120 Input unit
122 Secondary electron detector
123 Reflected electron detector
124 Moving stage

The invention claimed is:

1. A charged particle beam apparatus that inspects a defect in a pattern of a sample by the irradiation with an electron beam, the charged particle beam apparatus comprising:
   an electron optical system that detects secondary charged particles by irradiating the sample with the electron beam;
   an image processor that detects a defect by executing arithmetic processing on an image to be inspected that is obtained from the secondary charged particles; and
   a display unit that displays an image indicative of the defect,
   wherein the image processor includes
   a contour extractor that extracts the contour of the pattern by using a template image obtained on the basis of an image of the sample,
   an inspection target region setting unit that sets, on the basis of the contour of the pattern, a region to be inspected,
   a comparison arithmetic unit that compares the image to be inspected with an image of a part corresponding to the image to be inspected and detects a group of adjacent pixels of the image to be inspected having difference with respect to the image of the part corresponding to the image to be inspected as a defect candidate, and
   a defect determining unit that overlaps the defect candidate and the inspection target region, that determines an overlapping state between the defect candidate and the inspection target region, and that determines the defect candidate as a defect if the overlapping state is a predetermined overlapping state.

2. The charged particle beam apparatus according to claim 1,
   wherein the template image is an image obtained by summing a plurality of images of the sample.

3. The charged particle beam apparatus according to claim 1,
   wherein the electron optical system includes a plurality of detectors that detect the secondary charged particles, and
   wherein the image to be inspected and the template image are images obtained from different detectors.

4. The charged particle beam apparatus according to claim 1,
   wherein the template image is generated using the image to be inspected.

5. The charged particle beam apparatus according to claim 1,
   wherein the template image is used as the image of the part corresponding to the image to be inspected.

6. The charged particle beam apparatus according to claim 1, further comprising
   input means for specifying a region to be inspected,
   wherein the inspection target region setting unit sets the region to be inspected on the basis of an instruction provided by a user through the input means.

7. The charged particle beam apparatus according to claim 1,
wherein the region to be inspected is the inside or outside of the pattern.

8. The charged particle beam apparatus according to claim 1,
wherein the inspection target region setting unit enlarges or reduces all or a part of the contour of the pattern and treats all or the part of the contour of the pattern as the region to be inspected.

9. The charged particle beam apparatus according to claim 8,
wherein the inspection target region setting unit treats a difference with a region obtained on the basis of the enlarged or reduced contour of the pattern as the region to be inspected.

10. A charged particle beam apparatus that inspects a defect in a pattern of a sample by the irradiation with an electron beam, the charged particle beam apparatus comprising:
an electron optical system that detects secondary charged particles by irradiating the sample with the electron beam;
an image processor that detects a defect by executing arithmetic processing on an image to be inspected that is obtained from the secondary charged particles; and
a display unit that displays an image indicative of the defect,
wherein the image processor includes
a contour extractor that extracts the contour of the pattern by using a template image obtained on the basis of an image of the sample,
an inspection target region setting unit that sets, on the basis of the contour of the pattern, a region to be inspected, and
a pattern classifying unit that overlaps the image to be inspected and the inspection target region, that extracts a part corresponding to the inspection target region of the image to be inspected, and that classifies the pattern depending on the shape difference and a positional relationship between the inspection target region and the pattern included in the inspection target region.

11. The charged particle beam apparatus according to claim 10,
wherein the pattern is classified using a difference between the shape of the region to be inspected in the image to be inspected and the shape of the region to be inspected.

12. The charged particle beam apparatus according to claim 10,
wherein the display unit executes a statistical process on a result of the classification of the region to be inspected and displays the result of the classification of the region to be inspected.

13. A non-transitory storage medium storing a program that is executed by a computer connected to a charged particle beam apparatus, the program executing:
a contour extraction process of extracting the contour of a pattern of a sample using a template image obtained on the basis of an image of the sample;
an inspection target region setting process of setting, on the basis of the contour of the pattern, a region to be inspected;
an arithmetic comparison process of comparing an image to be inspected for the sample with an image of a part corresponding to the image to be inspected and detects a group of adjacent pixels of the image to be inspected having difference with respect to the image of the part corresponding to the image to be inspected sa a defect candidate; and
a defect determination process that overlaps the defect candidate and the inspection target region, that determines an overlapping state between the defect candidate and the inspection target region, and that determines the defect candidate as a defect if the overlapping state is a predetermined overlapping state.

14. A non-transitory storage medium storing a program that is executed by a computer connected to a charged particle beam apparatus, the program executing:
a contour extraction process of extracting the contour of a pattern of a sample using a template image obtained on the basis of an image of the sample;
an inspection target region setting process of setting, on the basis of the contour of the pattern, a region to be inspected; and
a pattern classification process of that overlaps an image to be inspected and the inspection target region, that extracts a part corresponding to the inspection target region of the image to be inspected, and that classifies that pattern depending on a shape difference and a positional relationship between the inspection target region and the pattern included in the inspection target region.

* * * * *